(12) United States Patent
Mueller et al.

(10) Patent No.: US 10,961,640 B2
(45) Date of Patent: Mar. 30, 2021

(54) SEMICONDUCTOR WAFER COMPOSED OF SINGLE-CRYSTAL SILICON WITH HIGH GATE OXIDE BREAKDOWN, AND A PROCESS FOR THE MANUFACTURE THEREOF

(71) Applicant: SILTRONIC AG, Munich (DE)

(72) Inventors: Timo Mueller, Burghausen (DE);
Michael Gehmlich, Weissenborn (DE);
Andreas Sattler, Trostberg (DE)

(73) Assignee: SILTRONIC AG, Munich (DE)

( * ) Notice: Subject to any disclaimer, the term of this patent is extended or adjusted under 35 U.S.C. 154(b) by 0 days.

(21) Appl. No.: 16/469,951

(22) PCT Filed: Dec. 8, 2017

(86) PCT No.: PCT/EP2017/082021
§ 371 (c)(1),
(2) Date: Jun. 14, 2019

(87) PCT Pub. No.: WO2018/108735
PCT Pub. Date: Jun. 21, 2018

(65) Prior Publication Data
US 2020/0240039 A1    Jul. 30, 2020

(30) Foreign Application Priority Data

Dec. 15, 2016 (DE) .................. 10 2016 225 138

(51) Int. Cl.
*C30B 15/00* (2006.01)
*C30B 33/02* (2006.01)
(Continued)

(52) U.S. Cl.
CPC .............. *C30B 29/06* (2013.01); *C30B 15/00* (2013.01); *C30B 33/02* (2013.01); *H01L 21/3225* (2013.01)

(58) Field of Classification Search
CPC ......... C30B 29/06; C30B 33/02; C30B 15/00; H01L 21/3225
See application file for complete search history.

(56) References Cited

U.S. PATENT DOCUMENTS 6,743,495 B2 * 6/2004 Vasat ................. H01L 29/06
428/64.1
2001/0055689 A1  12/2001 Park
(Continued)

FOREIGN PATENT DOCUMENTS

EP          1879224 A1    1/2008

*Primary Examiner* — Stephen M Bradley
*Assistant Examiner* — Gustavo G Ramallo
(74) *Attorney, Agent, or Firm* — Brooks Kushman P.C.

(57) ABSTRACT

Semiconductor wafers useful for NAND circuitry and having a front side, a rear side, a middle and a periphery, have an Nv region which extends from the middle to the periphery;
a denuded zone which extends from the front side to a depth of not less than 20 μm into the interior of the semiconductor wafer, where the density of vacancies in the denuded zone, determined by means of platinum diffusion and DLTS is not more than $1 \times 10^{13}$ vacancies/$cm^3$;
a concentration of oxygen of not less than $4.5 \times 10^{17}$ atoms/$cm^3$ and not more than $5.5 \times 10^{17}$ atoms/$cm^3$;
a region in the interior of the semiconductor wafer which adjoins the denuded zone and has nuclei which can be developed by means of a heat treatment into BMDs having a peak density of not less than $6.0 \times 10^9/cm^3$, where the heat treatment comprises heating the semiconductor wafer to a temperature of 800° C. over a period of four hours and to a temperature of 1000° C. over a period of 16 hours. The wafers are produced by a unique RTA treatment of Nv wafers.

11 Claims, 16 Drawing Sheets

(51) Int. Cl.
  *C30B 29/06* (2006.01)
  *H01L 21/322* (2006.01)

(56) References Cited

U.S. PATENT DOCUMENTS

| | | | |
|---|---|---|---|
| 2004/0194692 A1* | 10/2004 | Nishikawa | H01L 21/3225 117/84 |
| 2008/0113171 A1* | 5/2008 | Nakai | H01L 21/3225 428/218 |
| 2010/0105191 A1 | 4/2010 | Hayamizu et al. | |
| 2012/0001301 A1 | 1/2012 | Ebara et al. | |
| 2014/0044945 A1* | 2/2014 | Mueller | H01L 29/04 428/216 |
| 2016/0032491 A1* | 2/2016 | Lu | C30B 29/06 428/357 |

* cited by examiner

SEMICONDUCTOR WAFER COMPOSED OF SINGLE-CRYSTAL SILICON WITH HIGH GATE OXIDE BREAKDOWN, AND A PROCESS FOR THE MANUFACTURE THEREOF

CROSS REFERENCE TO RELATED APPLICATIONS

This application is the U.S. National Phase of PCT Appln. No. PCT/EP2017/082021 filed Dec. 8, 2017, which claims priority to German Application No. 10 2016 225 138.4 filed Dec. 15, 2016, the disclosures of which are incorporated in their entirety by reference herein.

BACKGROUND OF THE INVENTION

1. Field of the Invention

The invention relates to a semiconductor wafer composed of single-crystal silicon and a process for producing a semiconductor wafer composed of single-crystal silicon. Properties of the semiconductor wafer are a denuded zone (DZ) and an inner region of the semiconductor wafer having nuclei which can be developed into BMDs with a high peak density. The semiconductor wafer displays a high electrical breakdown resistance of a gate oxide which is produced on the surface thereof. It is therefore particularly suitable for producing electronic components with NAND logic, even under conditions which provide a comparatively small thermal budget.

The process for producing the semiconductor wafer composed of single-crystal silicon comprises two RTA treatments each in a different atmosphere at temperatures in particular temperature ranges.

2. Description of the Related Art

A semiconductor wafer having a denuded zone and an inner region having a comparatively high concentration of BMDs (bulk micro defects) is, for example, subject matter of US 2010/0 105 191 A1. To produce this known semiconductor wafer, a single crystal of silicon is grown by the CZ method and processed further to produce semiconductor wafers. When drawing the single crystal, care is taken to regulate the drawing speed V and the axial temperature gradient G at the interface between the single crystal and the melt in such a way that a neutral region N is formed. In the neutral region N, the concentration of interstitial silicon atoms (silicon interstitials) and vacancies is below the concentration threshold above which defects such as Lpits (large pits) and COPs (crystal originated particles) are formed. A neutral region in which silicon interstitials dominate over vacancies is referred to as Ni region. A neutral region in which vacancies dominate over silicon interstitials is referred to as Nv region. The process described in US 2010/0 105 191 A1 for producing a semiconductor wafer composed of single-crystal silicon comprises an RTA (rapid thermal anneal) treatment of the semiconductor wafer in an oxidizing atmosphere, followed by removal of an oxide layer which is formed during the RTA treatment and then an RTA treatment in a nitriding atmosphere.

The above-described known semiconductor wafer composed of single-crystal silicon does not completely meet all requirements of manufacturers of electronic components, in particular not those which are desirable for producing electronic components having NAND logic. It is therefore an object of the invention to provide a semiconductor wafer which is composed of single-crystal silicon and meets such requirements.

SUMMARY OF THE INVENTION

These and other objects are achieved by a semiconductor wafer composed of single-crystal silicon having a front side, a rear side, a middle and a periphery, comprising an Nv region which extends from the middle to the periphery;

a denuded zone which extends from the front side to a depth of not less than 20 μm into the interior of the semiconductor wafer, where the density of vacancies in the denuded zone, determined by means of platinum diffusion and DLTS is not more than $1 \times 10^{13}$ vacancies/cm$^3$;

a concentration of oxygen of not less than $4.5 \times 10^{17}$ atoms/cm$^3$ and not more than $5.5 \times 10^{17}$ atoms/cm$^3$;

a region in the interior of the semiconductor wafer which adjoins the denuded zone and has nuclei which can be developed by means of a heat treatment into BMDs having a peak density of not less than $6.0 \times 10^9$/cm$^3$, where the heat treatment comprises heating the semiconductor wafer to a temperature of 800° C. over a period of four hours and to a temperature of 1000° C. over a period of 16 hours.

DETAILED DESCRIPTION OF THE PREFERRED EMBODIMENTS

Figure 1:
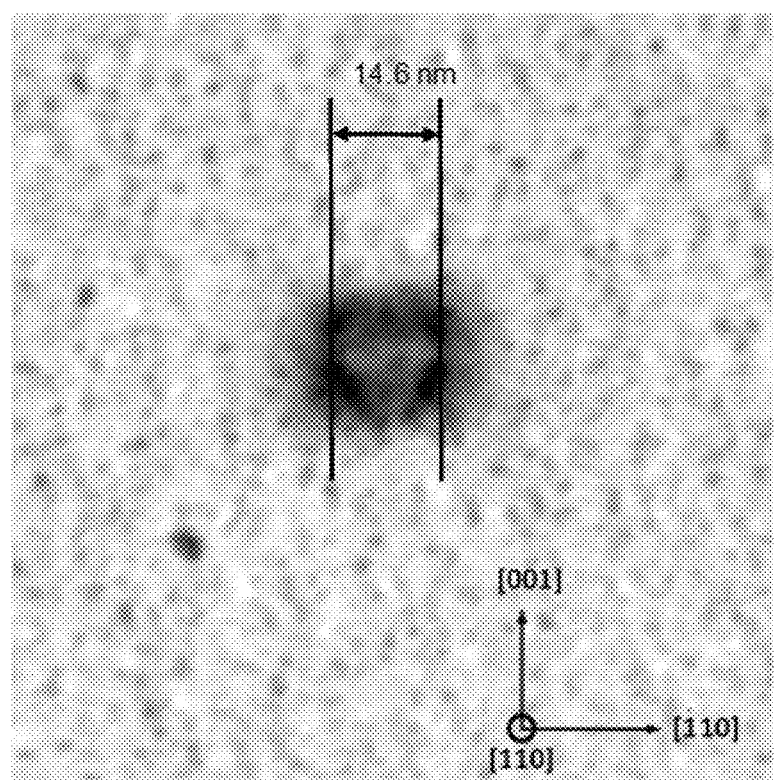
FIG. 1 shows a transmission electron micrograph of an octahedral oxygen precipitate.

The denuded zone is a region of the crystal lattice of the semiconductor wafer which is free of BMDs and in which no BMDs can be produced by means of the heat treatment.

The denuded zone extends from the front side of the semiconductor wafer into the interior of the semiconductor wafer to a depth of not less than 15 μm, preferably to a depth of not less than 20 μm. If the denuded zone has a lesser depth, the function of NAND memory elements is impaired because of the occurrence of leakage currents.

The semiconductor wafer composed of single-crystal silicon has a region in the interior of the semiconductor wafer which adjoins the denuded zone and contains nuclei which can be developed into BMDs by means of a heat treatment. BMDs act as energy sinks (getters) for impurities. This heat treatment comprises heating the semiconductor wafer composed of single-crystal silicon to a temperature of 800° C. over a period of four hours and subsequently heating the semiconductor wafer to a temperature of 1000° C. over a period of 16 hours or a heat treatment having a comparable thermal budget. The heat treatment is preferably carried out in an atmosphere which consists of ten parts by volume of nitrogen and one part by volume of oxygen.

After the heat treatment, the semiconductor wafer composed of single-crystal silicon has a peak density of BMDs of not less than $5.0 \times 10^9/cm^3$, preferably not less than $8.5 \times 10^9/cm^3$. The peak density of BMDs is preferably at a distance of not more than 100 μm from the front side of the semiconductor wafer. The front side is the surface of the semiconductor wafer composed of single-crystal silicon which is provided for the formation of structures of electronic components.

The radial distribution of the density of BMDs having a distance of from 9 μm to 340 μm from the front side of the semiconductor wafer is comparatively homogeneous, as is the radial distribution of the size of such BMDs. The ratio $D_{BMDmax}/D_{BMDmin}$ is preferably not more than 1.4. $D_{BMDmax}$ is the greatest density of such BMDs and $D_{BMDmin}$ is the lowest density of such BMDs between the middle and the periphery of the semiconductor wafer. The size of BMDs having a distance of from 9 μm to 340 μm from the front side of the semiconductor wafer is preferably in the range from 55 nm to 75 nm and refers to the length of the respective greatest dimension of the BMDs. The ratio $S_{BMDlarge}/S_{BMDsmall}$ is preferably not more than 1.3. $S_{BMDlarge}$ refers to the largest of the BMDs and $S_{BMDsmall}$ refers to the smallest of the BMDs between the middle and the periphery of the semiconductor wafer composed of single-crystal silicon.

The occurrence of the leakage currents mentioned above is connected to octahedral oxygen precipitates. These precipitates are formed, in particular, during cooling of the single crystal and have diameters of typically from 5 nm to 15 nm. These defects can grow into larger BMDs. In order to keep the denuded zone free of BMDs, it is necessary to eliminate oxygen precipitates of this type by means of a suitable RTA treatment.

The semiconductor wafer composed of single-crystal silicon has a denuded zone having a depth of not less than 15 μm, preferably not less than 20 μm, in which the density of vacancies is not more than $1 \times 10^{13}$ vacancies/$cm^3$, preferably not more than $7 \times 10^{12}$ vacancies/$cm^3$, determined by means of platinum diffusion and DLTS (deep level transient spectroscopy). The presence of vacancies promotes the formation of octahedral oxygen precipitates, for which reason the density of vacancies in the denuded zone should be comparatively low.

The semiconductor wafer composed of silicon has a concentration of oxygen of not less than $4.5 \times 10^{17}$ atoms/$cm^3$ and not more than $5.5 \times 10^{17}$ atoms/$cm^3$. If the concentration of oxygen is too low, the density of BMDs which can be developed in a region in the interior of the semiconductor wafer is insufficient and the BMDs cannot act effectively as getters. If the concentration of oxygen is too high, octahedral oxygen precipitates cannot be eliminated to a satisfactory extent and the fresh formation thereof cannot be satisfactorily prevented.

In particular, a gate oxide produced on the front side of the semiconductor wafer of the invention has a high breakdown resistance (GOI, gate oxide integrity). According to a GOI test (charge-to-breakdown test), the defect density DD at a distribution of the breakdown charge $Q_{db}$ of up to 0.1 C/$cm^2$ is less than 0.1/$cm^2$.

Objects of the invention are additionally achieved by a process for producing a semiconductor wafer composed of single-crystal silicon, which comprises, in this order, growing of a single crystal of silicon by the CZ method;

parting of at least one semiconductor wafer composed of single-crystal silicon from the single crystal, where the semiconductor wafer has a concentration of oxygen of not less than $4.5 \times 10^{17}$ atoms/$cm^3$ and not more than $5.5 \times 10^{17}$ atoms/$cm^3$ and consists entirely of Nv region;

a first RTA treatment of the semiconductor wafer composed of single-crystal silicon at a temperature in a first temperature range of not less than 1285° C. and not more than 1295° C. over a period of not less than 20 s and not more than 40 s in an atmosphere containing argon and oxygen;

chemical removal of an oxide layer from a front side of the semiconductor wafer;

a second RTA treatment of the semiconductor wafer composed of single-crystal silicon at a temperature in a second temperature range of not less than 1160° C. and not more than 1185° C. over a period of not less than 15 s and not more than 30 s in an atmosphere containing argon and ammonia and at a temperature in a third temperature range of not less than 1150° C. and not more than 1175° C. in an inert atmosphere over a period of not less than 20 s and not more than 40 s.

The production of a semiconductor wafer according to the invention composed of single-crystal silicon comprises growing of a single crystal by the CZ method, and further processing thereof to give semiconductor wafers. The further processing preferably comprises mechanical working by lapping and/or grinding of the semiconductor wafer separated off from the single crystal, removal of close-to-surface damaged crystal regions by pickling and precleaning of the semiconductor wafer in SC1 solution, SC2 solution and ozone. The semiconductor wafers composed of single-crystal silicon obtained from the single crystal by further processing are, in each case and in the order indicated, subjected to a first and second RTA treatment, with the composition of the atmosphere being changed during the second RTA treatment.

During growing of the single crystal, a magnetic field is preferably applied to the melt, most preferably a horizontal magnetic field or a CUSP magnetic field. The ratio V/G of drawing speed V and axial temperature gradient G at the interface is regulated in such a way that the semiconductor wafer composed of single-crystal silicon which is obtained by further processing of the single crystal consists entirely of Nv region. The restriction to Nv region has an advantageous effect on the ability of the semiconductor wafer composed of single-crystal silicon to be able to form a high concentration of BMDs in the inner region and on the property of the radial profile of the density of the BMDs from the middle to the periphery of the semiconductor wafer being particularly homogeneous.

The drawing speed V during growing of the single crystal is preferably not less than 0.5 mm/min if the production of semiconductor wafers having a diameter of 300 mm is envisaged.

The single crystal preferably grows in an atmosphere of argon or, more preferably, in an atmosphere containing argon and hydrogen. The partial pressure of hydrogen is preferably less than 40 Pa.

The semiconductor wafer composed of single-crystal silicon obtained from the single crystal has a concentration of oxygen of not less than $4.5 \times 10^{17}$ atoms/cm$^3$ and not more than $5.5 \times 10^{17}$ atoms/cm$^3$ (new ASTM). It is known that the concentration of oxygen in the single crystal can be set during production thereof, for example by regulating the speed of rotation of the crucible and/or of the single crystal and/or by regulating the pressure and/or the flow rate of the gas forming the atmosphere in which the single crystal grows and/or by regulating the magnetic field strength of the magnetic field applied to the melt.

The first RTA treatment comprises rapid heating of the semiconductor wafer composed of single-crystal silicon to a temperature in a temperature range of not less than 1285° C. and not more than 1295° C. and holding of the semiconductor wafer in this temperature range over a period of not less than 20 s and not more than 40 s. The hold temperature and the hold time should be not less than 1285° C. and not less than 20 s, respectively, so that octahedral oxygen precipitates are effectively eliminated. However, they should also be not more than 1295° C. and not more than 40 s, respectively, because otherwise there is a particular risk of triggering slip dislocations. The first RTA treatment is carried out in an atmosphere containing argon and oxygen. The proportion of oxygen is preferably not more than 3% by volume. Particular preference is given to a proportion of oxygen of not less than 0.5% by volume and not more than 3% by volume.

During the first RTA treatment, thermal oxide is formed on the surface of the treated semiconductor wafer and this is removed by a chemical method after the first RTA treatment. For this purpose, the semiconductor wafer composed of single-crystal silicon is preferably treated firstly with aqueous HF solution, then with SC1 solution and finally with SC2 solution. The HF solution preferably contains 0.5% by weight of HF, the SC1 solution preferably contains five parts by volume of water, one part by volume of 27% strength by weight ammonium hydroxide in water and one part by volume of 30% strength by weight hydrogen peroxide in water, and the SC2 solution preferably contains six parts by volume of water, one part by volume of 30% strength by weight hydrogen peroxide in water and one part by volume of 37% strength by weight hydrogen chloride in water.

The second RTA treatment comprises rapid heating of the semiconductor wafer composed of single-crystal silicon to a temperature in a temperature range of not less than 1160° C. and not more than 1185° C. and holding of the semiconductor wafer in this temperature range over a period of not less than 15 s and not more than 30 s in an atmosphere which contains argon and ammonia and preferably consists of argon and ammonia. The volume ratio Ar:NH$_3$ is preferably not less than 10:10 and not more than 10:5, more preferably 10:8. The flow rate of the gas mixture through the RTA furnace is preferably not less than 2 slm and not more than 5 slm. After the RTA treatment in an atmosphere containing argon and ammonia, the semiconductor wafer composed of single-crystal silicon is treated further at a temperature in a temperature range of not less than 1150° C. and not more than 1175° C. over a period of not less than 20 s and not more than 40 s in an inert atmosphere. The composition of the atmosphere is changed and the RTA treatment of the semiconductor wafer is continued at the same temperature. As an alternative, preference is given to firstly cooling the semiconductor wafer to not less than 600° C., flushing the RTA furnace with nitrogen until it is free of ammonia and subsequently heating the semiconductor wafer in an inert atmosphere to the target temperature in the temperature range of not less than 1150° C. and not more than 1175° C. The inert atmosphere preferably consists of argon. The further treatment of the semiconductor wafer in the inert atmosphere is of particular importance because it reduces the density of vacancies in the region of the denuded zone sufficiently and thus prevents oxygen precipitates from being freshly formed there.

The rapid heating of the semiconductor wafer composed of single-crystal silicon in the course of the first and second RTA treatments is preferably carried out at a rate of temperature rise of not less than 15° C./s, particularly preferably not less than 25° C./s, from a temperature of 600° C. to the target temperature. Cooling after the first RTA treatment and after the second RTA treatment is preferably carried out at a cooling rate of not less than 25° C./s, at least until a temperature of 600° C. has been attained. The rate of the temperature rise and the cooling rate at temperatures which are up to 100° C. away from the target temperature are preferably lower than in the case of temperatures which are farther away.

After the second RTA treatment, the semiconductor wafer composed of single-crystal silicon is polished, preferably by means of DSP (double side polishing), that is to say by means of simultaneous polishing of the upper side face and the lower side face, followed by polishing of an orientation notch in the semiconductor wafer and polishing of an edge of the semiconductor wafer. The region of the upper side face, the front side of the semiconductor wafer, is normally employed for formation of electronic components, for which reason final polishing of the front side by means of CMP (chemical mechanical polishing) is particularly preferred. Subsequently, the polished semiconductor wafer is preferably finally cleaned and dried.

A semiconductor wafer composed of single-crystal silicon and produced by the above-described process is particularly suitable for producing electronic components having NAND logic, even under conditions which provide a comparatively small thermal budget. Prerequisites for this suitability are a denuded zone which is comparatively deep, a high electrical breakdown resistance of a gate oxide produced on the semiconductor wafer and the ability to form a high density of BMDs in the inner region of the semiconductor wafer despite a comparatively low concentration of oxygen and despite provision of a thermal budget for producing the BMDs which is comparatively small.

The invention will be illustrated below with the aid of examples and with reference to figures.

Single crystals of silicon were produced by the CZ method with a horizontal magnetic field being applied to the melt and were processed further to give semiconductor wafers composed of single-crystal silicon and having a diameter of 300 mm and a polished surface. One part of the semiconductor wafers was subjected to the RTA treatments according to the invention. These semiconductor wafers, which consisted of Nv region from the middle to the periphery, were divided into three groups as a function of the concentration of interstitial oxygen present therein (low Oi, medium Oi and high Oi). The oxygen concentration was from $4.5 \times 10^{17}$ atoms/cm$^3$ to $5 \times 10^{17}$ atoms/cm$^3$ (l Oi) or from more than $5 \times 10^{17}$ atoms/cm$^3$ to $5.25 \times 10^{17}$ atoms/cm$^3$ (m Oi) or from more than $5.25 \times 10^{17}$ atoms/cm$^3$ to $5.5 \times 10^{17}$ atoms/cm$^3$ (h Oi).

The semiconductor wafers of the three groups had octahedral oxygen precipitates. A typical representative thereof can be seen in FIG. 1 which shows a bright field transmission electron micrograph.

During the course of the first RTA treatment, the semiconductor wafers were heated in the temperature range from 600° C. to 750° C. in an RTA furnace at a rate of 75° C./s, in the temperature range from more than 750° C. to 1200° C. at a rate of 50-75° C./s and in the temperature range from more than 1200° C. to the target temperature of 1290° C. at a rate of 25° C./s and held at the target temperature over a period of 30 s.

The semiconductor wafers were then rapidly cooled, in the temperature range from the target temperature to more than 1200° C. at a rate of 25° C./s, in the temperature range from 1200° C. to more than 900° C. at a rate of 35° C./s and in the temperature range from 900° C. to 600° C. at a rate of 30° C./s. The atmosphere in the RTA furnace consisted of a mixture of argon and oxygen having a proportion by volume of oxygen of 1%.

After the first RTA treatment, the semiconductor wafers were subjected to a chemical treatment which comprised removal of an oxygen layer from the respective front side which had been formed during the course of the first RTA treatment. The chemical treatment consisted of treatment of the semiconductor wafers with aqueous HF solution, subsequently treatment of the semiconductor wafers with SC1 solution and finally treatment of the semiconductor wafers with SC2 solution.

The semiconductor wafers were then rinsed with water, dried and passed to the second RTA treatment.

During the course of the second RTA treatment, the semiconductor wafers were heated in the temperature range from 600° C. to the target temperature of 1175° C. at a rate of 75° C./s and held at the target temperature over a period of 20 s. The atmosphere in the RTA furnace consisted of a mixture of argon and ammonia with a volume ratio of Ar:NH$_3$ of 13.5:10 until the end of this period of time. A change was then made to an atmosphere of argon. The semiconductor wafers were firstly cooled to 600° C. and held at this temperature over a period of 40 s, and the RTA furnace was flushed with nitrogen during this time. The semiconductor wafers were then heated to a target temperature of 1160° C. in an atmosphere of argon, held at this target temperature for a period of 30 s and subsequently cooled rapidly. In the temperature range from 600° C. to 750° C., the temperature was increased at a rate of 75° C./s, in the temperature range from more than 750° C. to 1100° C. at a rate of 50-75° C./s and in the temperature range from more than 1100° C. to the target temperature of 1160° C. at a rate of 75° C./s. In the temperature range from the target temperature of 1160° C. to a temperature of more than 1100° C., the temperature was reduced at a rate of 25° C./s, in the temperature range from 1100° C. to a temperature of more than 900° C. at a rate of 35° C./s and in the temperature range from 900° C. to 600° C. at a rate of 30° C./s.

After the second RTA treatment, the semiconductor wafers composed of single-crystal silicon were subjected to polishing by means of DSP, polishing of the edge and polishing of the front side by means of CMP, finally cleaned and dried.

For part of these semiconductor wafers, the depth profile of vacancies was determined by means of platinum diffusion and DLTS, for another part the breakdown resistance of a gate oxide was determined and for a further part the ability to develop BMDs in an interior region during the course of a heat treatment was determined.

To determine the depth profile of vacancies, a test specimen was cut from the semiconductor wafer to be examined and platinum was deposited on that side of the test specimen which belonged to the rear side of the semiconductor wafer. The test specimen had an area of 25 mm×12 mm and was heated to 730° C. in a nitrogen atmosphere over a period of one hour in order to diffuse platinum into the test specimen. The front side of the test specimen was subsequently ground and polished in order to produce a bevel having a beveling angle of from 0.2° to 1.3°. The beveling angle determines the depth x the resolution of the depth profile of vacancies. The test specimen was firstly dipped into acetone and subsequently into dilute hydrofluoric acid (DHF) in order to clean it. To produce Schottky diodes, round contacts composed of titanium and having a diameter of 1.4 mm and a thickness of 100 nm were deposited on the surface of the bevel, and ohmic contacts composed of indium-gallium were deposited on the rear side.

To determine the concentration of substitutional platinum $c_{Pt}$ by means of DLTS, a spectrometer of the type DL 8000 was used under the following instrumental conditions: reverse bias voltage $U_R$=5 V; pulse voltage $U_P$=0.01 V; pulse width $t_p$=100 μs and time window of recording of the transients (period width) $T_w$=5 ms. The DLTS peak which can be assigned to the energy level $E_v$=0.33 eV was evaluated. The concentration $c_{Pt}(x)$ determined in this way as a function of the depth x was converted into a concentration of vacancies $c_v(x)$ according to the following formula:

$$c_v(x) = c_{Pt}(x)\left(1 + \frac{c_v^{eq}}{c_{Pt}^{eq}}\right) = c_{Pt}(x) \times 1.78$$

To determine the breakdown resistance of a gate oxide, the front side of the semiconductor wafer to be measured was provided with 800 MOS capacitors having electrodes composed of polycrystalline silicon, the capacitors were subjected to a GOI test (charge to breakdown test) using a stepped current ramp and the distribution of breakdown charge Qdb (breakdown charge density distribution) was determined. The gate oxide of the capacitors had a thickness of 25 nm and an area of 8 nm$^2$.

To determine the ability to develop BMDs in an inner region (BMD test), the semiconductor wafers were firstly heat treated in an atmosphere composed of a mixture of oxygen and nitrogen with a volume ration of $O_2:N_2$ of 1:10 at a temperature of 800° C. over a period of 4 hours and subsequently at a temperature of 1000° C. over a period of 16 hours.

The semiconductor wafers were then examined by means of IR-LST (infrared light scattering tomography). To determine the depth of the denuded zone, the radial density distribution and the radial size distribution of BMDs, an analytical tool model LST-300A from the manufacturer Semilab Co. Ltd., Hungary was provided.

Figure 2:
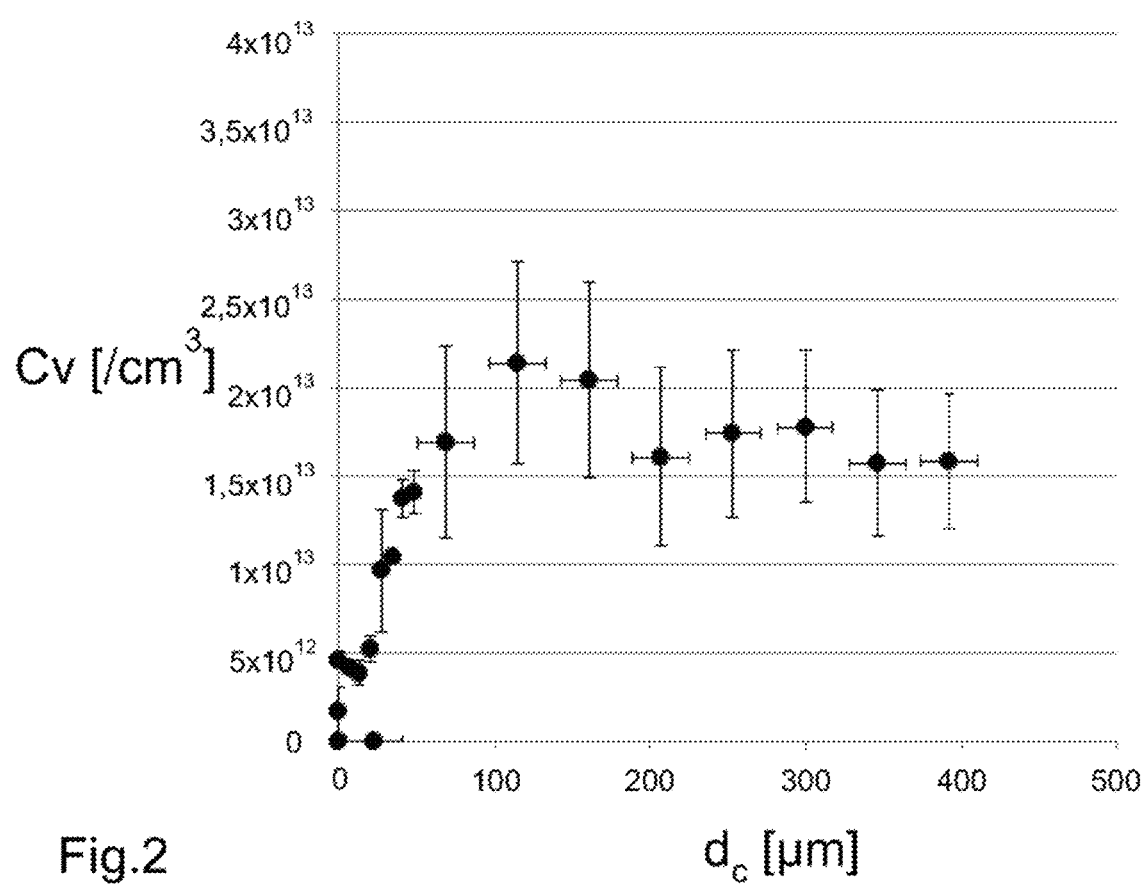
FIG. 2 shows the density of vacancies Cv as a function of the depth do for the example of a semiconductor wafer according to the invention.
Figure 3:
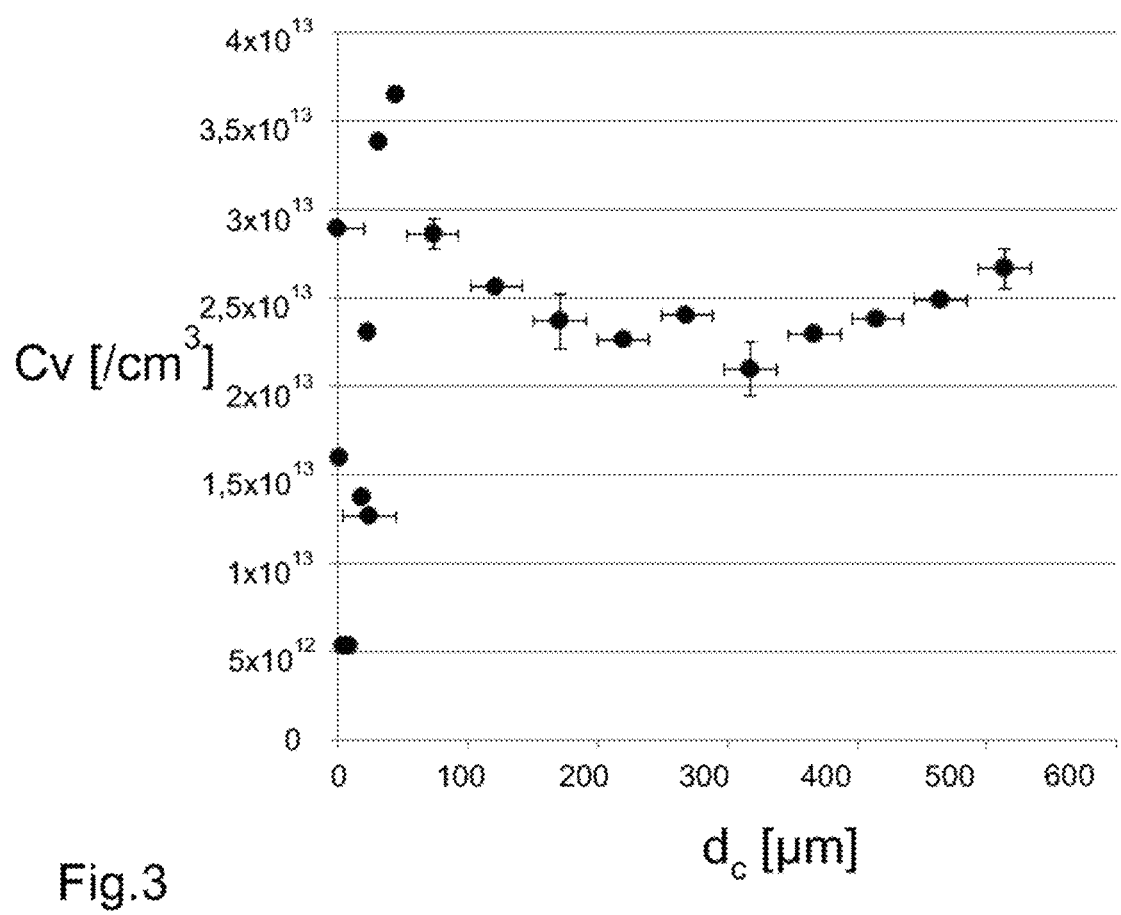
FIG. 3 shows the density of vacancies Cv as a function of the depth do for the example of a semiconductor wafer which is not according to the invention.

FIG. 2 shows a representative result in respect of the density of vacancies Cv as a function of the depth $d_c$, with the density having been determined by platinum diffusion and DLTS. The depth profile in the middle of a semiconductor wafer according to the invention from the front side into the interior of the semiconductor wafer was measured. FIG. 3 shows, for the purposes of comparison, a corresponding depth profile of a semiconductor wafer which was not according to the invention because the further treatment in an inert atmosphere during the second RTA treatment was omitted during production thereof and the density of vacancies in the denuded zone was therefore too high.

Figure 4:
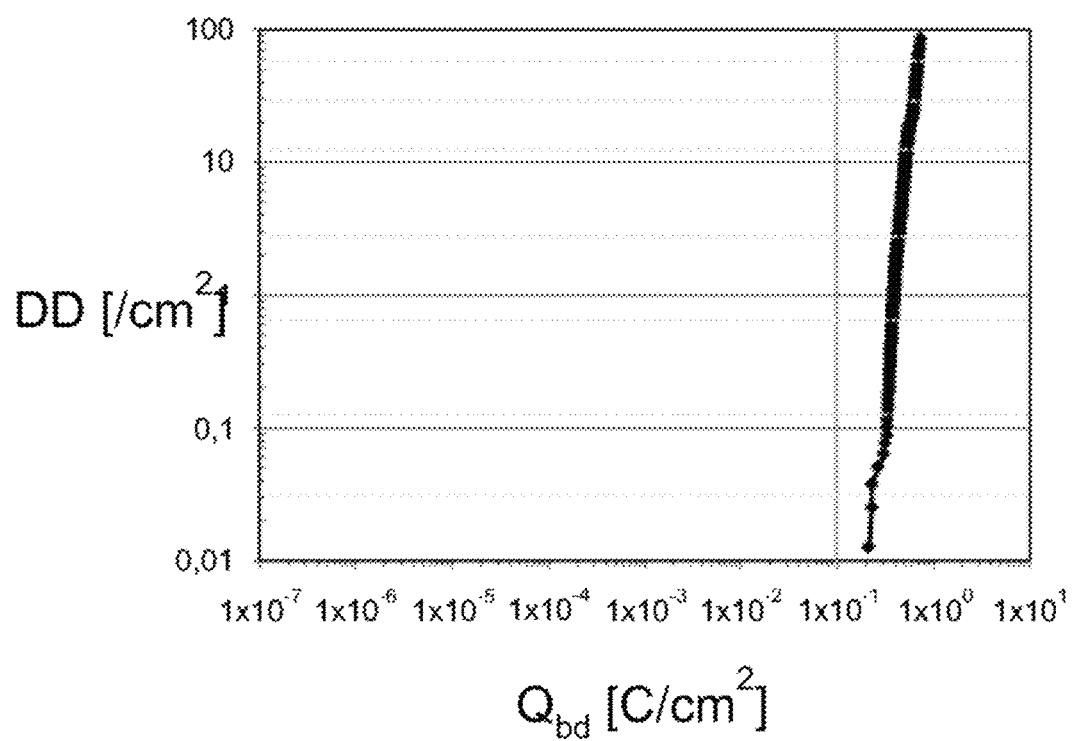
FIG. 4 shows a representative result of a test to determine the breakdown resistance of a gate oxide for the example of a semiconductor wafer according to the invention.

FIG. 4 shows a representative result of a test to determine the breakdown resistance of a gate oxide for the example of a semiconductor wafer according to the invention. The defect density DD is plotted as a function of $Q_{bd}$, where Nf is the number of failing capacitors, Nt is the number of capacitors present and Ag is the area of the gate oxide composed of silicon dioxide and the defect density is defined as follows:

$$DD=-\ln(1-Nf/Nt)Ag$$

Figure 5:
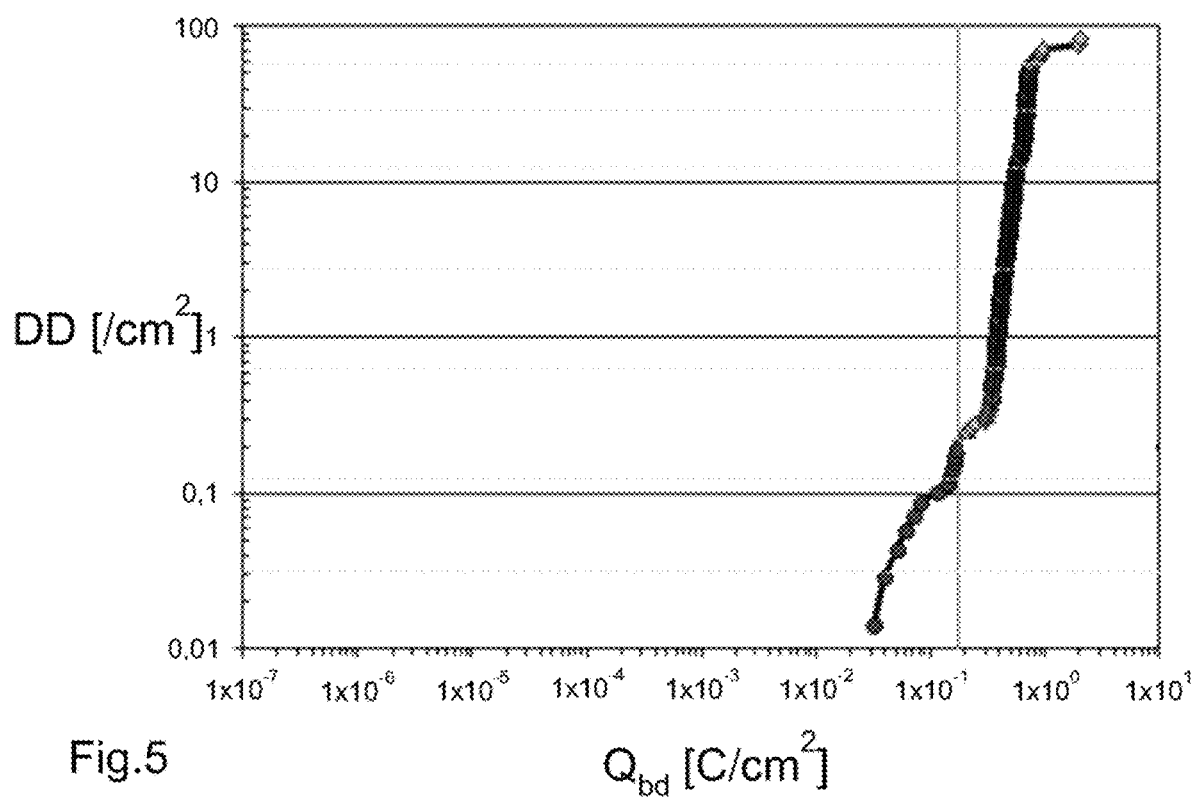
FIG. 5 and FIG. 6 show the result of tests to determine the breakdown resistance of a gate oxide for the example of semiconductor wafers which are not according to the invention.

FIG. 5 shows, for the purpose of comparison, a corresponding depiction of the breakdown resistance of a gate oxide of a semiconductor wafer which was not according to the invention because the temperature in the first RTA treatment was 1250° C. and therefore too low during the production thereof and the duration of this treatment had been selected as 15 s and therefore too short.

Figure 6:
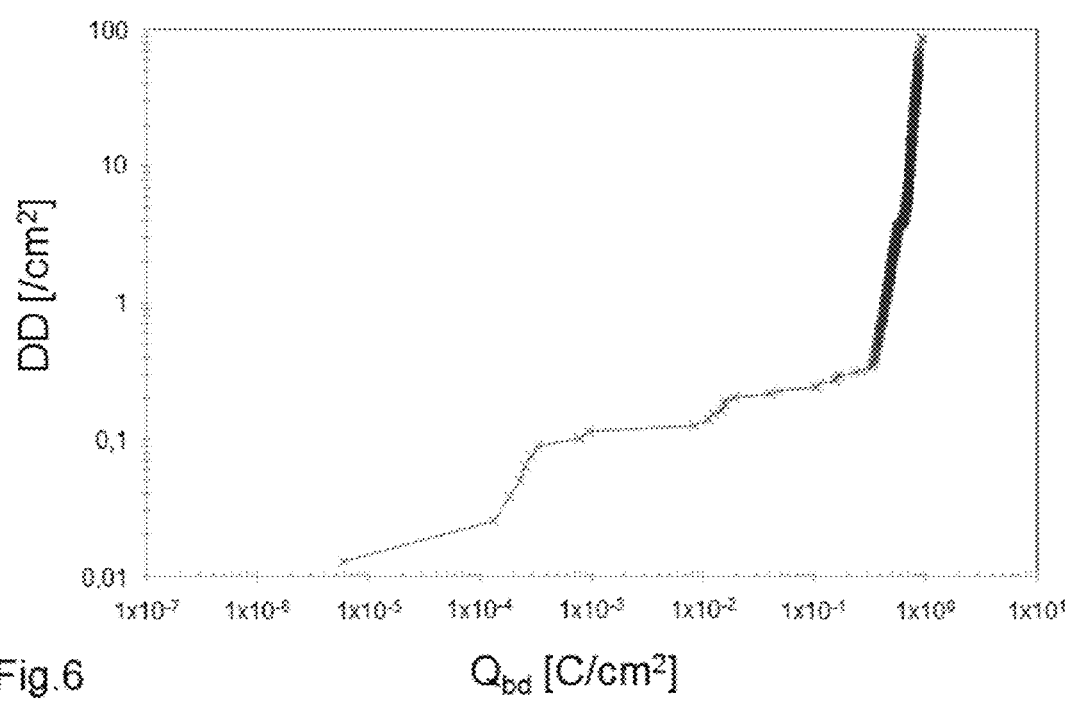

FIG. 6 shows a further corresponding depiction of the breakdown resistance of a gate oxide of a semiconductor wafer which was not according to the invention because the temperature in the first RTA treatment was 1250° C. and therefore too low during the production thereof. The duration of the first RTA treatment was 30 s. Extending the first RTA treatment therefore did not lead to an improved result as long as the temperature of the first RTA treatment is selected too low.

Figure 7:
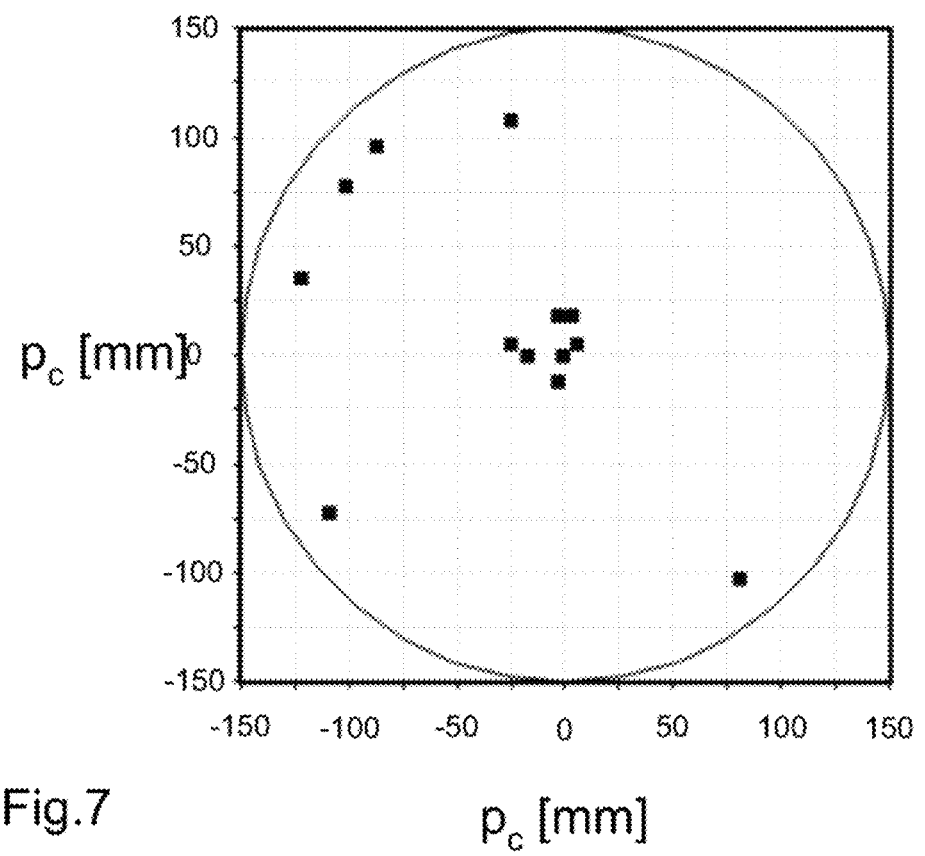
FIG. 7 and FIG. 8 show the position of failing capacitors for the example of semiconductor wafers which are not according to the invention.

FIG. 7 represents a card on which the position of the capacitors which failed in the GOI test, the result of which is shown in FIG. 5, up to $Q_{db}$ of 0.1/cm$^2$ is drawn in. The position of the capacitors is drawn in relation to the distance $p_c$ thereof from the middle of the semiconductor wafer. These capacitors are without exception close to the middle and to the periphery of the semiconductor wafer and thus in regions having a comparatively high density of vacancies.

Figure 8:
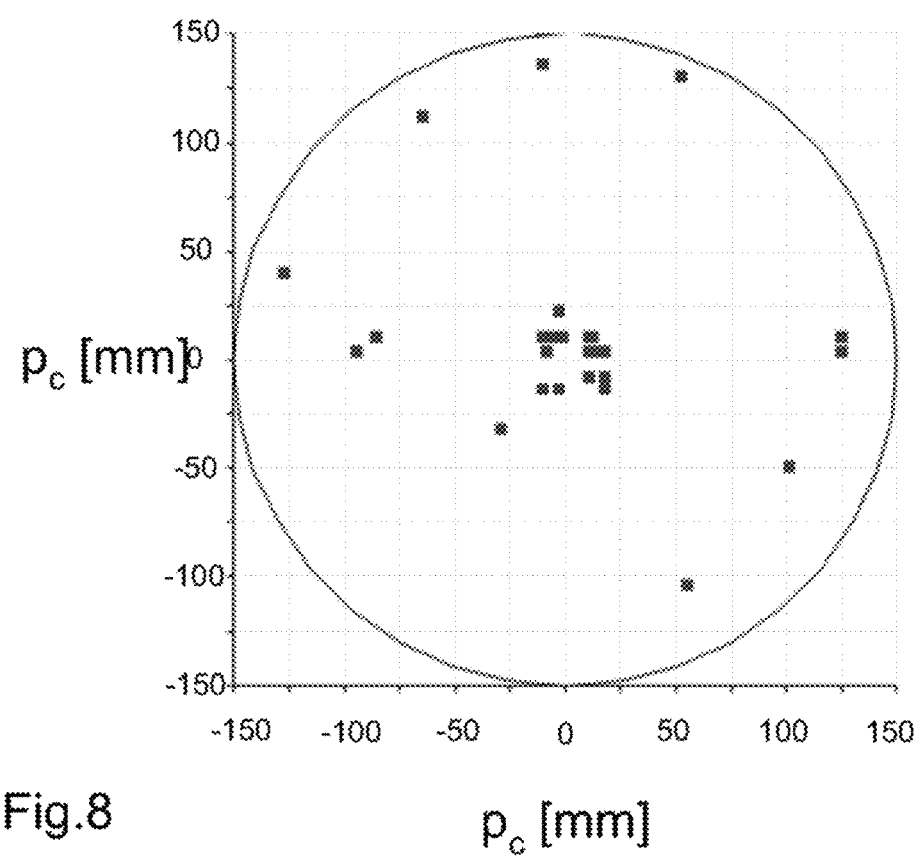

FIG. 8 represents a card corresponding to FIG. 7 and relates to the semiconductor wafer which is not according to the invention and to which FIG. 6 also relates. Extending the first RTA treatment to 30 s thus also results in barely any improvement in the failure of capacitors as long as the temperature of the first RTA treatment is selected as 1250° C. and therefore too low.

Figure 9:
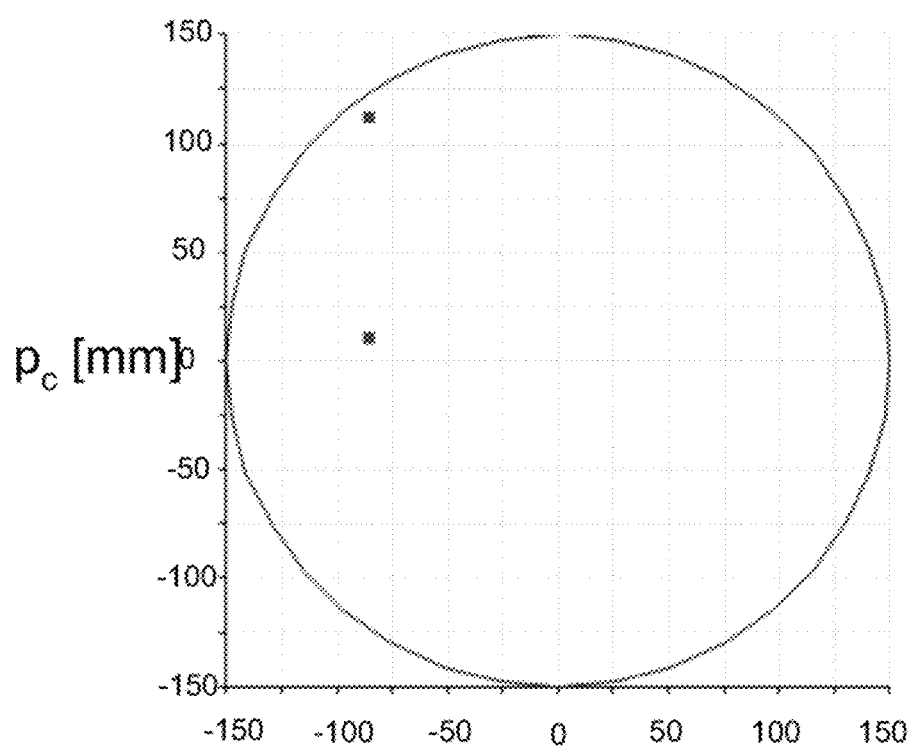
FIG. 9 shows the position of failing capacitors for the example of a semiconductor wafer which is according to the invention.

FIG. 9 represents a card corresponding to FIG. 7 and FIG. 8 and relates to the semiconductor wafer according to the invention to which FIG. 4 also relates. The production of this semiconductor wafer comprised a first RTA treatment at a temperature of 1290° C. over a period of 30 s. The low failure of capacitors demonstrates that oxygen precipitates could be effectively eliminated.

Figure 10:
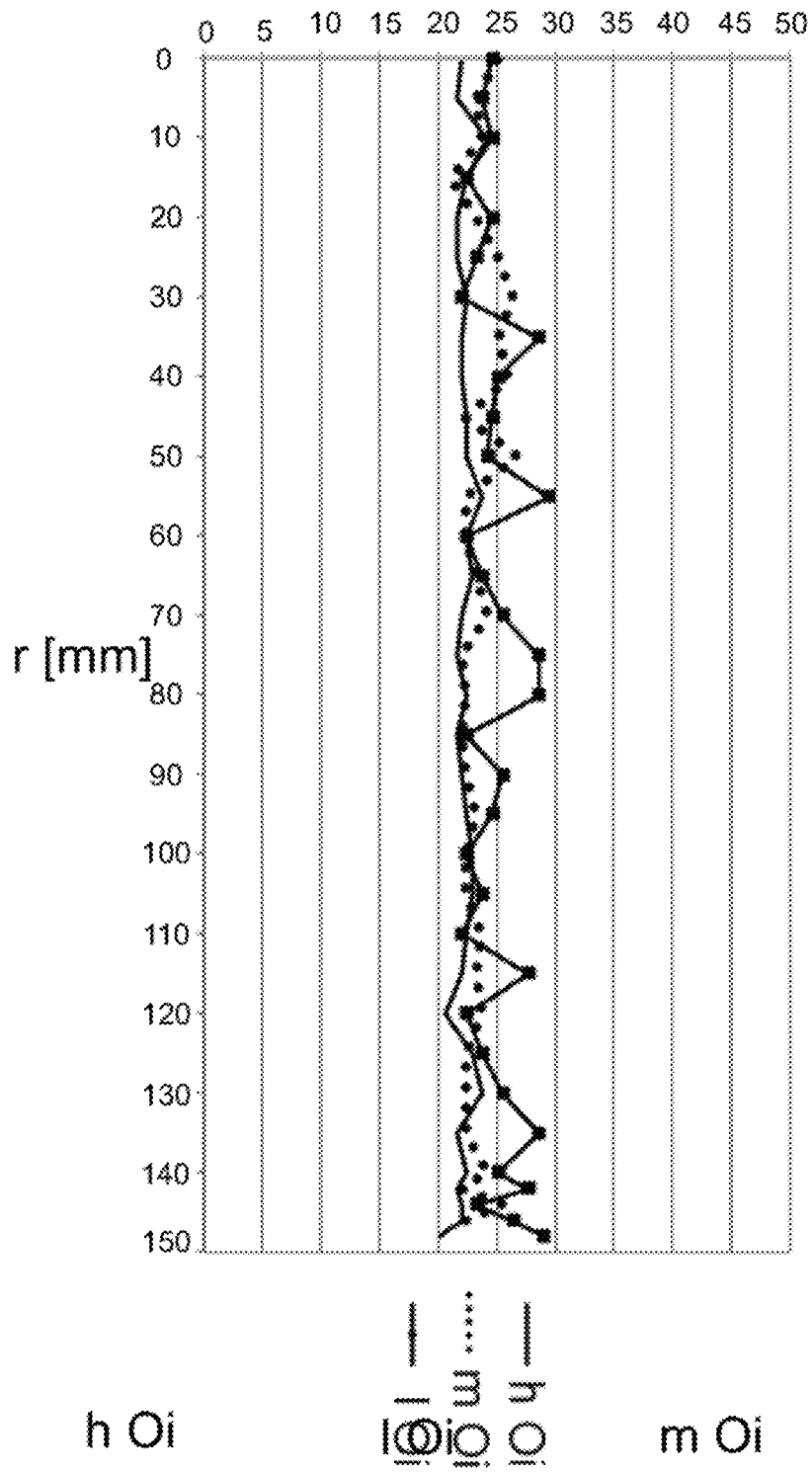
FIG. 10 and FIG. 11 show the depth of the denuded zone as a function of the radius for the example of semiconductor wafers according to the invention and for the example of semiconductor wafers which are not according to the invention.

FIG. 10 shows, for a representative example, the depth of the denuded zone as a function of the radius r of a semiconductor wafer according to the invention, with the profile of the depth having been determined during the course of the above-described BMD test. The graph (FIG. 10) shows the distance DZ of the first BMD found at the corresponding radial position from the front side of the semiconductor wafer.

Figure 11:
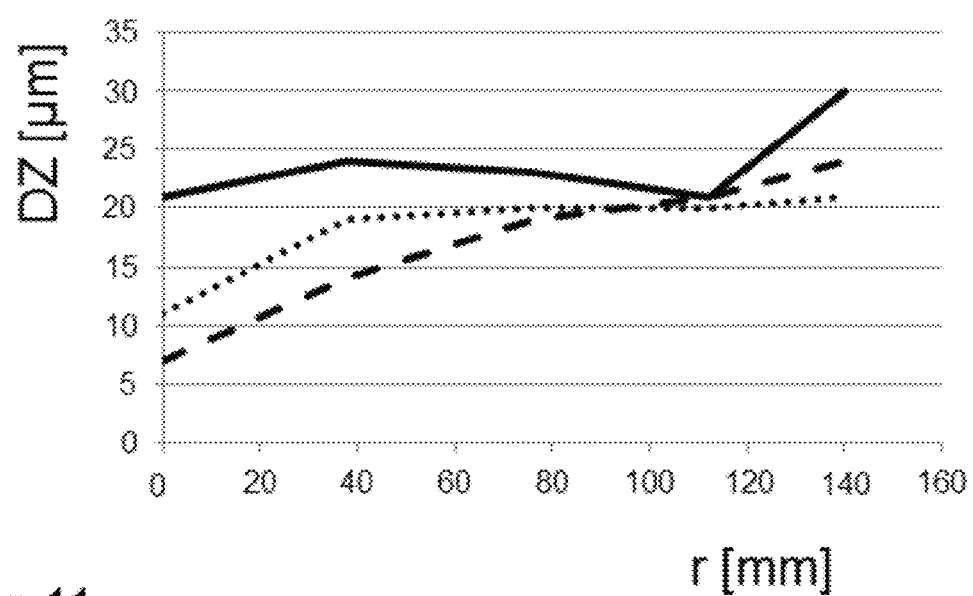

FIG. 11 is a depiction corresponding to that of FIG. 10. Example (solid line) and comparative examples (dotted and broken lines) in each case show the depth of the denuded zone as a function of the radius r. The example belongs to a semiconductor wafer produced according to the invention; the comparative examples belong to semiconductor wafers which had not been produced according to the invention. The only difference in the production process was the target temperature of the first RTA treatment. It was 1290° C. (example) or 1250° C. (comparative examples).

Figure 12:
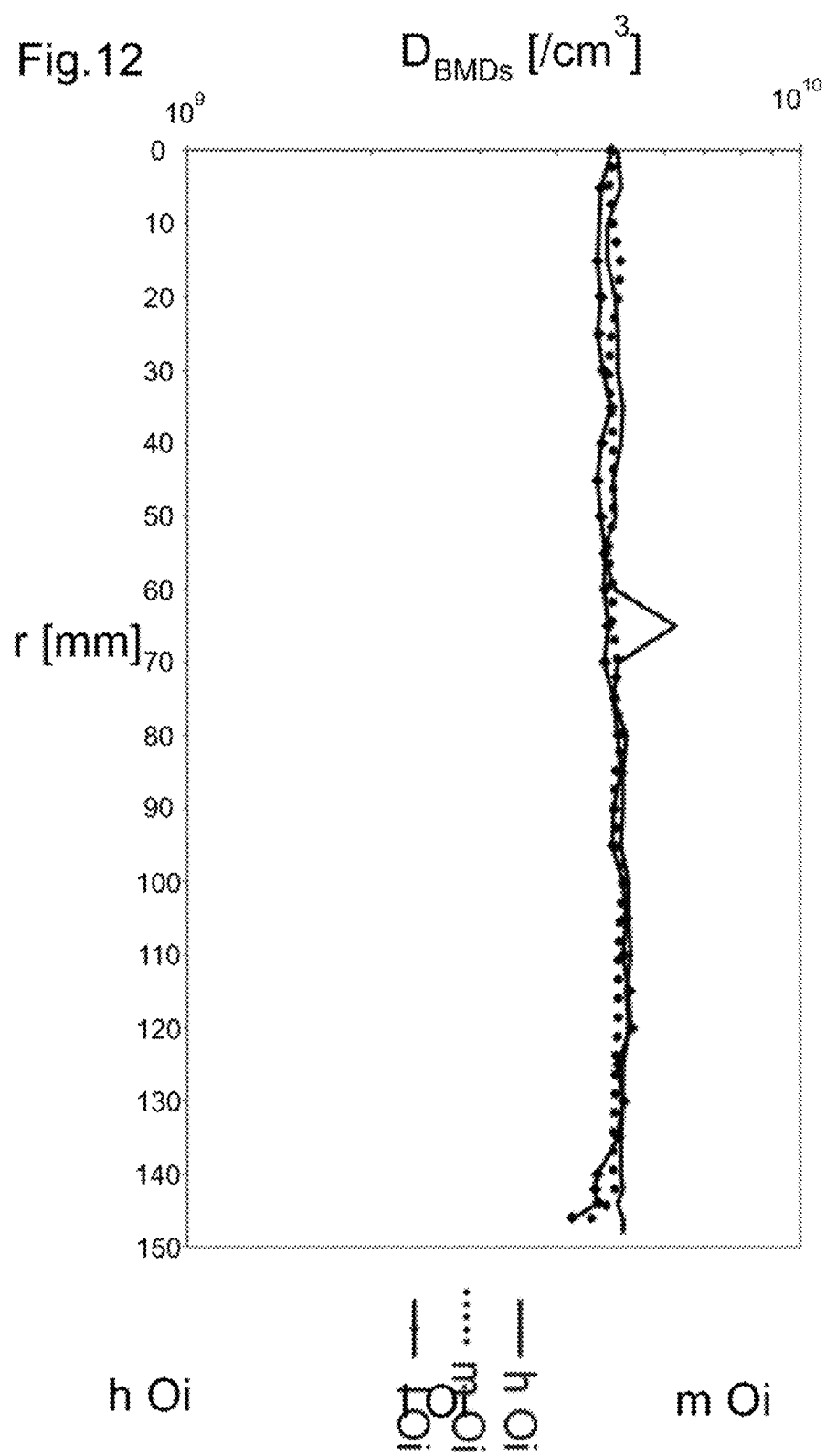
FIG. 12 shows the density of BMDs at a particular depth relative to the front side and as a function of the radius for the example of a semiconductor wafer according to the invention.
Figure 13:
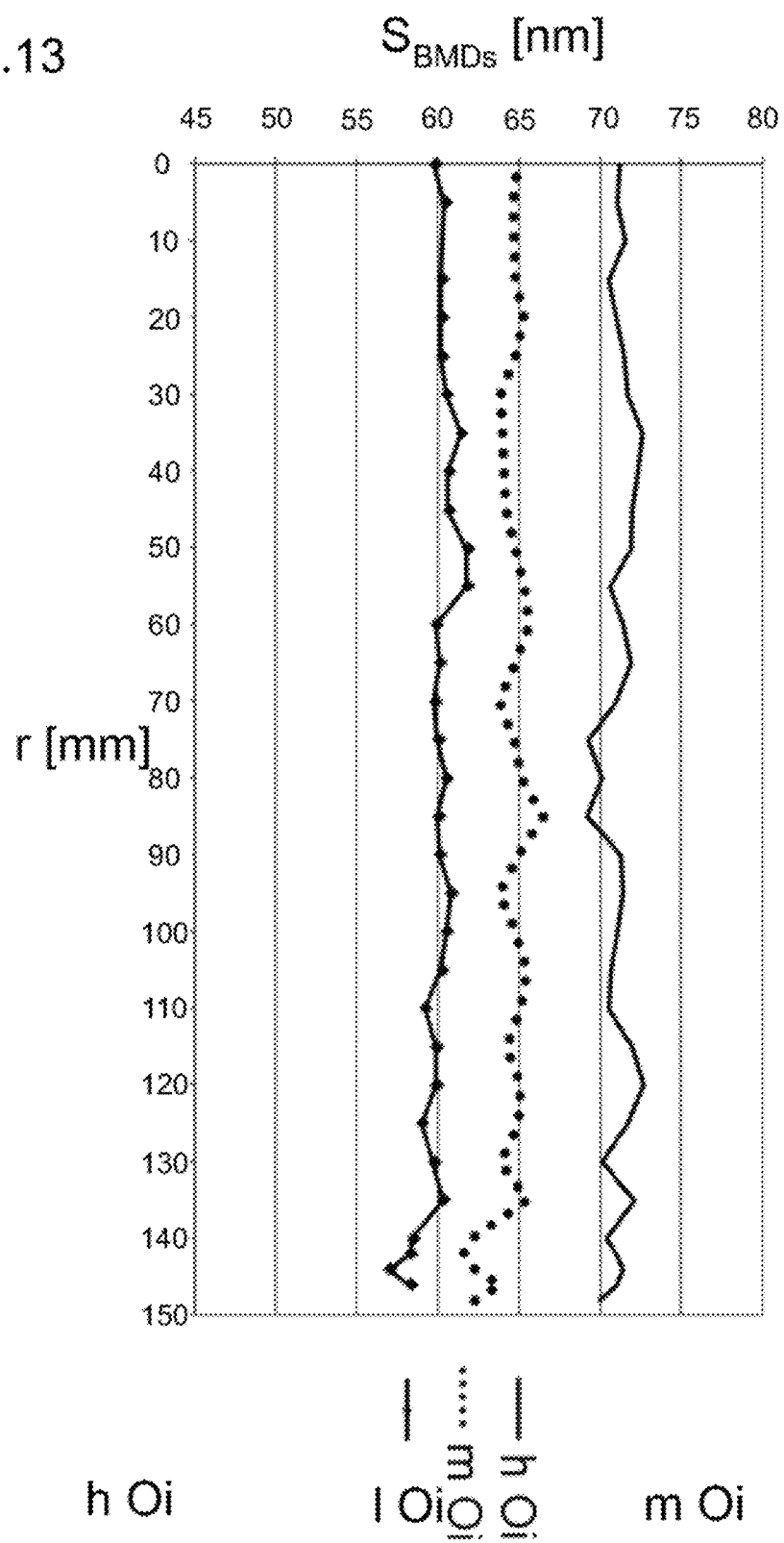
FIG. 13 shows the size of the BMDs as a function of the radius for the BMDs of FIG. 12.

FIG. 12 shows, for a representative example, the density of BMDs as a function of the radius r of a semiconductor wafer according to the invention, with the profile of the density having been determined in the course of the above-described BMD test. $D_{BMDs}$ represents the average of the BMD densities which were found in an interior region of the semiconductor wafer having a distance of from 9 μm to 340 μm from the front side of the semiconductor wafer. FIG. 13 shows the size of the BMDs of the semiconductor wafer as a function of the radius r of this semiconductor wafer. $S_{BMDs}$ represents the average of the sizes of the BMDs which were found in the interior region of the semiconductor wafer.

Figure 14:
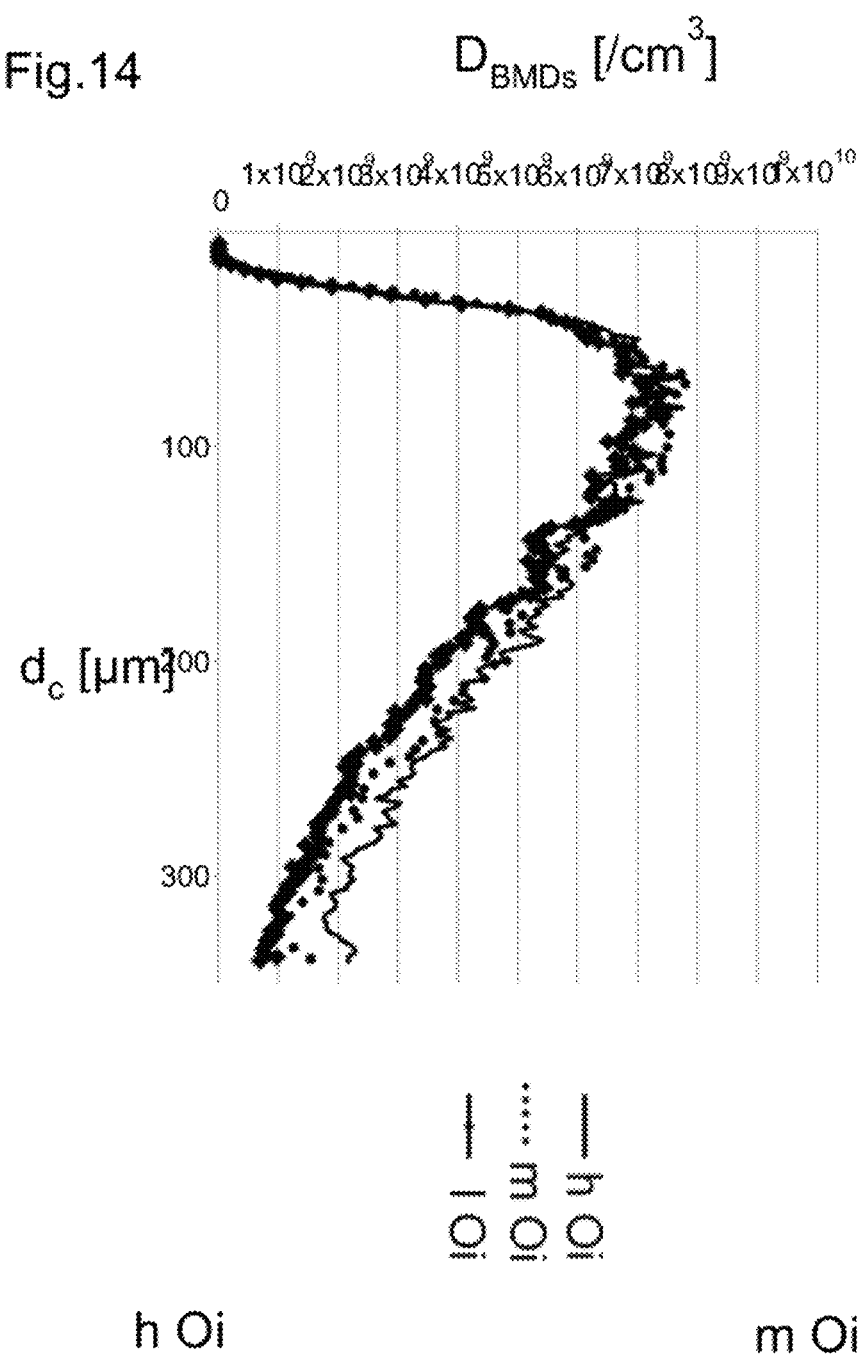
FIG. 14, FIG. 15 and FIG. 16 show depth profiles of the density of BMDs from the front side down to a depth of somewhat deeper than 300 μm for the example of a semiconductor wafer according to the invention.
Figure 15:
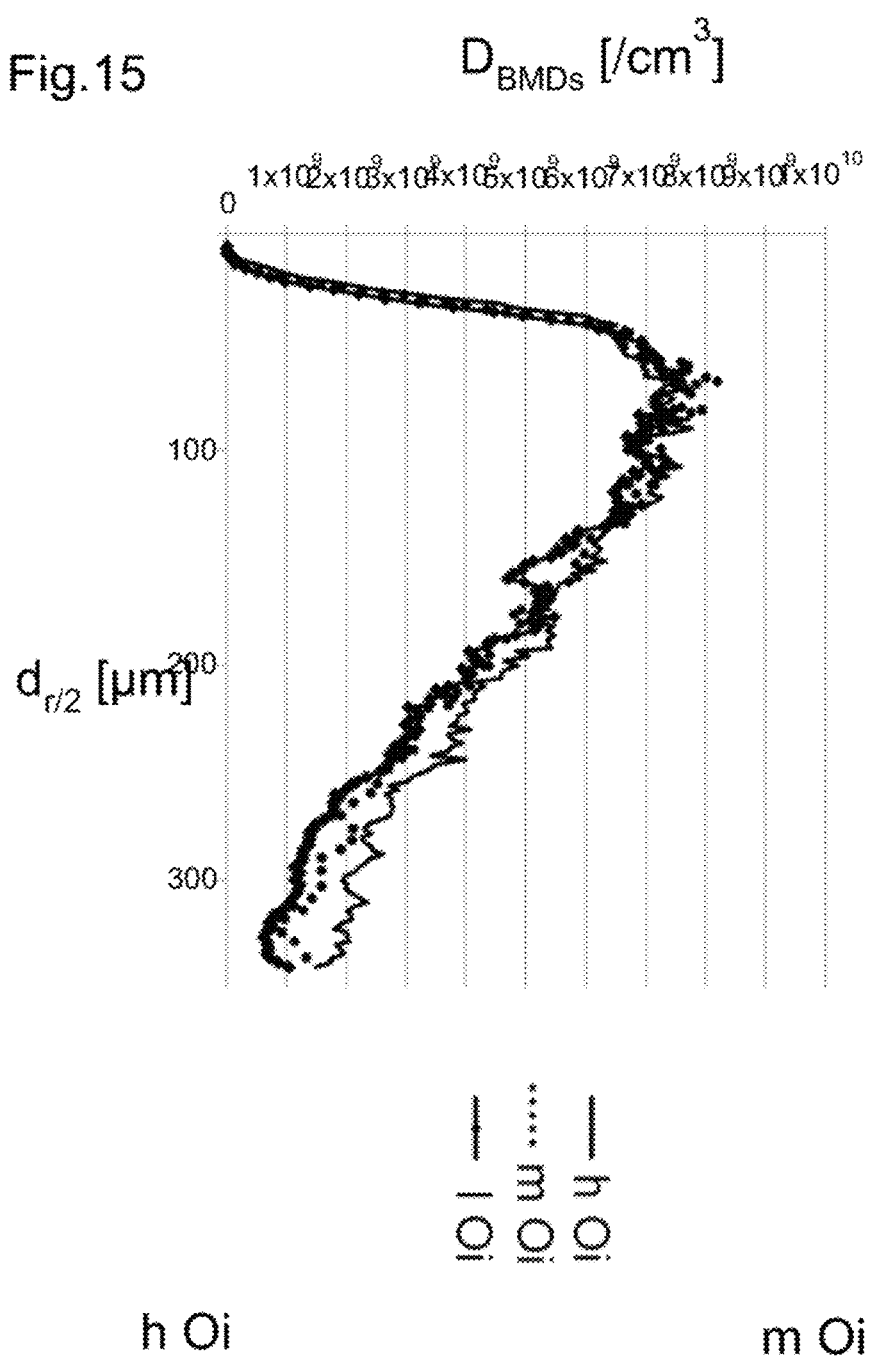
Figure 16:
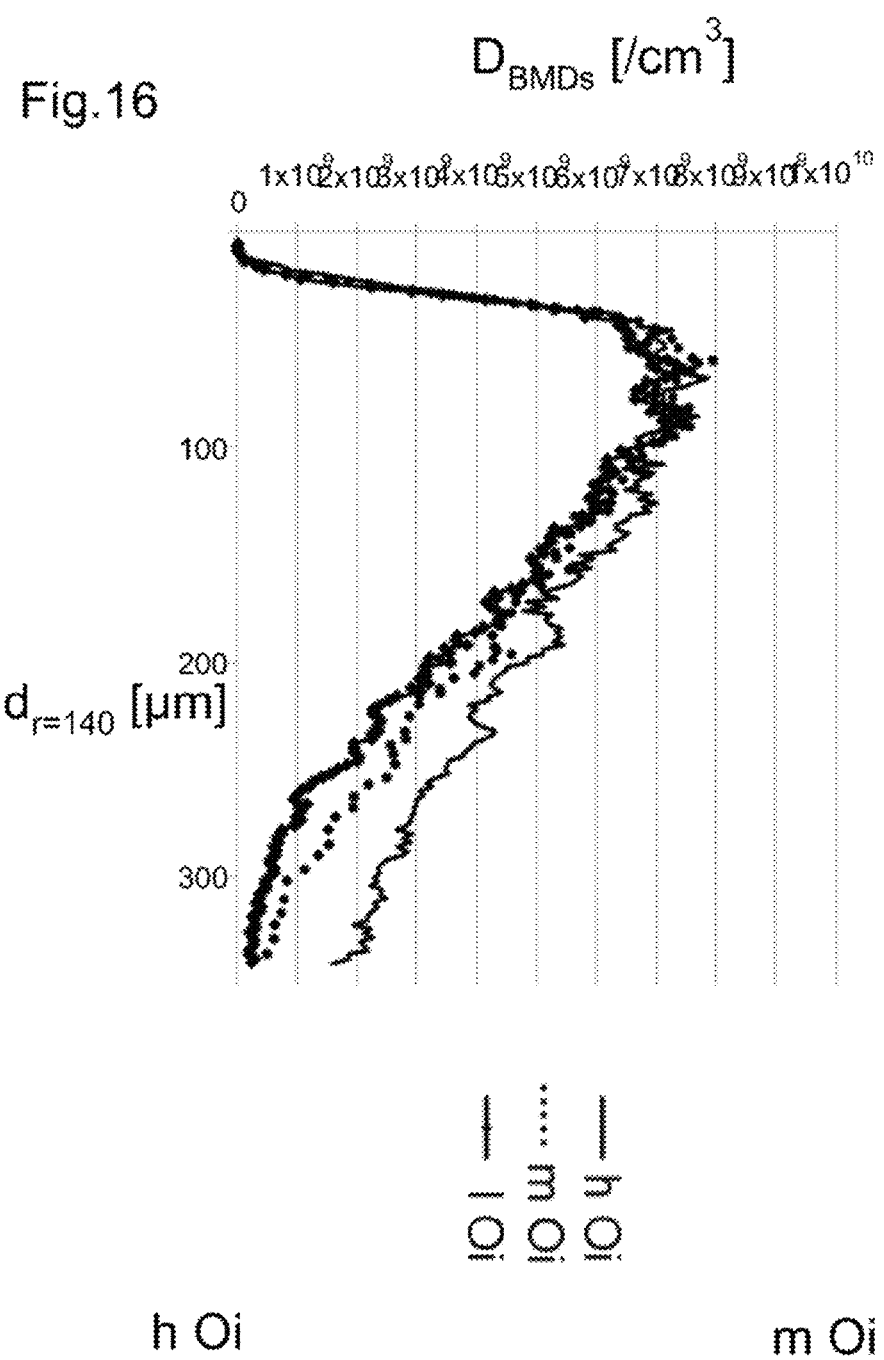

FIG. 14, FIG. 15 and FIG. 16 show, for a representative example, depth profiles of the density of BMDs from the front side to a depth of somewhat deeper than 300 μm, with the depth profiles having been determined in the course of the above-described BMD test. The graphs show the density of the BMDs of a semiconductor wafer according to the invention as a function of the distance from the front side of the semiconductor wafer, where $d_c$ is the distance in the middle of the semiconductor wafer (FIG. 14), $d_{r/2}$ is the distance at the position on the semiconductor wafer having a radius of 75 mm (FIG. 15) and $d_{r=140}$ is the distance at the position of the semiconductor wafer having a radius of 140 mm (FIG. 16).

The invention claimed is:

1. A semiconductor wafer comprising of single-crystal silicon, having a front side, a rear side, a middle and a periphery, comprising:
    an Nv region which extends from the middle to the periphery;
    a denuded zone which extends from the front side to a depth of not less than 20 μm into the interior of the semiconductor wafer, where the density of vacancies in the denuded zone, determined by means of platinum diffusion and DLTS is not more than 1×10$^{13}$ vacancies/cm$^3$;
    a concentration of oxygen of not less than 4.5×10$^{17}$ atoms/cm$^3$ and not more than 5.5×10$^{17}$ atoms/cm$^3$;
    a region in the interior of the semiconductor wafer which adjoins the denuded zone and has nuclei which are identifiable by developing with a heat treatment into BMDs, the BMDs having a peak density of not less than 5.5×10$^9$/cm$^3$, where the heat treatment comprises heating the semiconductor wafer to a temperature of 800° C. over a period of four hours and to a temperature of 1000° C. over a period of 16 hours.

2. The semiconductor wafer of claim 1, wherein the peak density of BMDs is at a distance of not more than 100 μm from the front side of the semiconductor wafer.

3. The semiconductor wafer of claim 1, wherein the average of the density of BMDs at depths of from 9 μm to 340 μm from the front side of the semiconductor wafer, from the middle to the periphery of the semiconductor wafer, satisfies the condition that the ratio $D_{BMDmax}/D_{BMDmin}$ is not more than 1.4, where $D_{BMDmax}$ is the greatest density of BMDs and $D_{BMDmin}$ is the lowest density of BMDs.

4. The semiconductor wafer of claim 1, wherein the size of BMDs at depths of from 9 μm to 340 μm from the front side of the semiconductor wafer, from the middle to the periphery of the semiconductor wafer, satisfies the condition that the ratio $S_{BMDlarge}/S_{BMDsmall}$ is not more than 1.3, where $S_{BMDlarge}$ is the largest of the BMDs and $S_{BMDsmall}$ is the smallest of the BMDs.

5. A process for producing a semiconductor wafer comprising single-crystal silicon of claim 1, which comprises, in this order growing of a single crystal of silicon by the CZ method;

parting of at least one semiconductor wafer composed of single-crystal silicon from the single crystal, where the semiconductor wafer has a concentration of oxygen of not less than $4.5 \times 10^{17}$ atoms/cm$^3$ and not more than $5.5 \times 10^{17}$ atoms/cm$^3$ and consists entirely of Nv region;

treating the at least one semiconductor wafer in a first RTA treatment at a temperature in a first temperature range of not less than 1285° C. and not more than 1295° C. over a period of not less than 20 s and not more than 40 s in an atmosphere containing argon and oxygen;

chemically treating the semiconductor wafer by a treatment which comprises chemical removal of an oxide layer from a front side of the semiconductor wafer;

treating the at least one semiconductor wafer in a second RTA treatment at a temperature in a second temperature range of not less than 1160° C. and not more than 1185° C. over a period of not less than 15 s and not more than 30 s in an atmosphere containing argon and ammonia, and at a temperature in a third temperature range of not less than 1150° C. and not more than 1175° C. in an inert atmosphere over a period of not less than 20 s and not more than 40 s.

6. The process of claim 5, wherein growing of the single crystal is carried out in an atmosphere containing argon and hydrogen.

7. The process of claim 5, wherein a single crystal is grown at a pulling speed of not less than 0.5 mm/min and the single crystal has a diameter of at least 300 mm.

8. The process of claim 5, wherein the RTA treatment in the third temperature range is carried out in an atmosphere of argon.

9. The process of claim 5, wherein a heat treatment of the semiconductor wafer composed of single-crystal silicon is carried out after the RTA treatment in the third temperature range and the heating of the semiconductor wafer to a temperature of 800° C. is carried out over a period of 4 hours and the heating of the semiconductor wafer to a temperature of 1000° C. is carried out over a period of 16 hours.

10. The semiconductor wafer of claim 1, wherein the concentration of oxygen is not less than $4.5 \times 10^{17}$ atoms/cm$^3$ and not more than $5.0 \times 10^{17}$ atoms/cm$^3$.

11. A process for producing a semiconductor wafer comprising single-crystal silicon, which comprises, in this order growing of a single crystal of silicon by the CZ method;

parting of at least one semiconductor wafer composed of single-crystal silicon from the single crystal, where the semiconductor wafer has a concentration of oxygen of not less than $4.5 \times 10^{17}$ atoms/cm$^3$ and not more than $5.5 \times 10^{17}$ atoms/cm$^3$ and consists entirely of Nv region;

treating the at least one semiconductor wafer in a first RTA treatment at a temperature in a first temperature range of not less than 1285° C. and not more than 1295° C. over a period of not less than 20 s and not more than 40 s in an atmosphere containing argon and oxygen;

chemically treating the semiconductor wafer by a treatment which comprises chemical removal of an oxide layer from a front side of the semiconductor wafer;

treating the at least one semiconductor wafer in a second RTA treatment at a temperature in a second temperature range of not less than 1160° C. and not more than 1185° C. over a period of not less than 15 s and not more than 30 s in an atmosphere containing argon and ammonia, and at a temperature in a third temperature range of not less than 1150° C. and not more than 1175° C. in an inert atmosphere over a period of not less than 20 s and not more than 40 s.

* * * * *